(12) United States Patent
Fogel et al.

(10) Patent No.: US 8,026,613 B2
(45) Date of Patent: Sep. 27, 2011

(54) INTERCONNECTIONS FOR FLIP-CHIP USING LEAD-FREE SOLDERS AND HAVING REACTION BARRIER LAYERS

(75) Inventors: Keith E. Fogel, Hopewell Junction, NY (US); Balaram Ghosal, Fishkill, NY (US); Sung K. Kang, Chappaqua, NY (US); Stephen Kilpatrick, Olney, MD (US); Paul A. Lauro, Brewster, NY (US); Henry A. Nye, III, Brookfield, CT (US); Da-Yuan Shih, Poughkeepsie, NY (US); Donna S. Zupanski-Nielsen, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 311 days.

(21) Appl. No.: 12/113,108

(22) Filed: Apr. 30, 2008

(65) Prior Publication Data

US 2008/0203585 A1    Aug. 28, 2008

Related U.S. Application Data

(62) Division of application No. 10/815,103, filed on Mar. 31, 2004, now Pat. No. 7,410,833.

(51) Int. Cl.
*H01L 23/48* (2006.01)
*H01L 23/52* (2006.01)
*H01L 29/40* (2006.01)

(52) U.S. Cl. ............... 257/778; 438/751; 257/E23.141
(58) Field of Classification Search ................. 438/751, 438/753, 779, 781; 257/778
See application file for complete search history.

(56) References Cited

U.S. PATENT DOCUMENTS

| 4,835,593 A | 5/1989 | Arnold et al. |
| 5,162,257 A | 11/1992 | Yung |

(Continued)

FOREIGN PATENT DOCUMENTS

JP    6-177134    6/1994

(Continued)

OTHER PUBLICATIONS

Datta et al., Elctrochemical Fabrication of Mechanically Robust PbSn C4. Interconnections, J. Electrochem. Soc., 142, 3779 (1995).

(Continued)

*Primary Examiner* — Chuong A Luu
*Assistant Examiner* — Nga Doan
(74) *Attorney, Agent, or Firm* — Daniel P. Morris; David Aker (57) ABSTRACT

An interconnection structure suitable for flip-chip attachment of microelectronic device chips to packages, comprising a two, three or four layer ball-limiting composition including an adhesion/reaction barrier layer, and having a solder wettable layer reactive with components of a tin-containing lead free solder, so that the solderable layer can be totally consumed during soldering, but a barrier layer remains after being placed in contact with the lead free solder during soldering. One or more lead-free solder balls is selectively situated on the solder wetting layer, the lead-free solder balls comprising tin as a predominant component and one or more alloying components. With a two-layer ball-limiting composition comprising an adhesion/reaction barrier layer, wherein the adhesion/reaction barrier layer serves both as an adhesion layer and a reaction barrier layer, the adhesion/reaction barrier layer can be comprised of a material selected from the group consisting of Zr and ZrN.

6 Claims, 3 Drawing Sheets

U.S. PATENT DOCUMENTS

| | | | |
|---|---|---|---|
| 5,244,143 A | 9/1993 | Ference et al. | |
| 5,532,612 A | 7/1996 | Liang | |
| 5,767,010 A | 6/1998 | Mis et al. | |
| 5,775,569 A | 7/1998 | Berger et al. | |
| 5,937,320 A | 8/1999 | Andricacos | |
| 6,003,757 A | 12/1999 | Beaumont | |
| 6,056,191 A | 5/2000 | Brouillette et al. | |
| 6,620,720 B1 * | 9/2003 | Moyer et al. | 438/612 |
| 6,756,671 B2 | 6/2004 | Lee et al. | |
| 6,872,465 B2 | 3/2005 | Soga et al. | |
| 7,064,446 B2 | 6/2006 | Barnak et al. | |
| 7,081,404 B2 | 7/2006 | Jan et al. | |
| 2003/0222352 A1 * | 12/2003 | Kung et al. | 257/772 |
| 2004/0104484 A1 * | 6/2004 | Chen et al. | 257/772 |
| 2005/0039824 A1 | 2/2005 | Nishina et al. | |

FOREIGN PATENT DOCUMENTS

| | | |
|---|---|---|
| JP | 2000-058577 | 2/2000 |
| JP | 2000-150574 | 5/2000 |
| JP | 2001-102402 | 4/2001 |
| JP | 2002-026049 | 1/2002 |

OTHER PUBLICATIONS

Harper, Electronic Packaging and Interconnection Handbook, C.A. Harper Editor-in-Chief, McGraw-Hill, 6.6-6.7, 6.13-6.15 (2000).

* cited by examiner

INTERCONNECTIONS FOR FLIP-CHIP USING LEAD-FREE SOLDERS AND HAVING REACTION BARRIER LAYERS

This application is a divisional of application Ser. No. 10/815,103 filed on Mar. 31, 2004 now U.S. Pat. No. 7,410,833, which is incorporated herein by reference, in its entirety.

FIELD OF THE INVENTION

This invention relates to the interconnection of microelectronic integrated circuit (IC) chips to packages, and in particular area-array flip-chip interconnect technology often called C4 (controlled collapse chip connection). The invention further pertains to interconnection schemes that are environmentally acceptable due to the use of lead-free solder alloys and environmentally benign fabrication processes. Further, the invention pertains to interconnection schemes that eliminate sources of soft errors in on-chip circuitry through the elimination of alpha-particle sources in the solder in contact with the microelectronics circuit.

BACKGROUND OF THE INVENTION

In the packaging of semiconductor chips, a hierarchy of interconnections is necessary. At the level of the interconnection between the chip and the substrate (or chip carrier), three different interconnection technologies are widely employed: tape automated bonding (TAB), wire bonding, and area array flip chip interconnect.

The solder bump area array interconnect scheme is often called a flip-chip solder connection or C4, the face-down soldering of integrated circuit devices (IC) to chip carriers. Unlike wirebonding, the area array solder bump configuration allows the entire surface of the chip to be covered with C4 bumps for the highest possible input/output (I/O) counts to meet the ever increasing demand on the electrical functionality and reliability of the IC technology, than can wire bonding or TAB, which confine the interconnections to the chip periphery.

More specifically, the C4 technology uses solder bumps deposited on a patterned solder-wettable layered structure known as the ball-limiting metallurgy (BLM), which is also called under bump metallurgy (UBM). UBM defines the terminal metal pads on the top surface of the chip that is wettable by the solder, and which also limits the lateral flow to the pad area. After the solder bumps are reflowed on the patterned UBM pads on the chip to form balls, the chips are joined to a matching footprint of solder-wettable layers on the chip carrier. It is the face-down placement of the chip on the carrier that has led C4 technology to be called flip-chip joining. Compared to other methods of interconnection, the C4 technology offers distinct advantages, including the following: 1) shorter interconnect distances, allowing faster signal response and lower inductance; 2) more uniform power and heat distribution; 3) reduced simultaneous switching noise; and 4) greater design flexibility with the highest possible total input/output counts.

Fabrication of PbSn C4 interconnections by evaporation through a metal mask has been developed and perfected since the mid-1960s. Both the C4 bumps and BLM pads are evaporated through the patterned metal masks to form a highly reliable, high-density interconnect structure; it has proven extendability from the earliest low density, low Input/output counts IC devices through the high density, high input/output count products of the 2000s. However, it is believed that the limit of extendibility to larger wafer sizes, more dense arrays and Pb-free applications has nearly been reached by the evaporation method.

An alternative method to evaporation is electrochemical fabrication of C4s, which is a selective and efficient process. Electrochemical C4 fabrication has been reported in the literature by, for example, Yung in U.S. Pat. No. 5,162,257, which is incorporated herein by reference. Manufacturability and other integration issues of electrochemically fabricated C4s have been described by Datta, et al. in the J. Electrochem. Soc., 142, 3779 (1995), which is incorporated herein by reference. Using plating and etching processes, and through the development of sophisticated tools, it is possible to obtain a high degree of compositional and volume uniformity of electroplated solders, uniform dimensions of the ball-limiting metallurgy (BLM), and a controlled BLM edge profile.

The electrochemical process is more extendible to larger wafers and to finer C4 dimensions than the evaporated C4 technology. Electrodeposition through a photoresist mask produces solder only in the mask opening and on top of the UBM. Electrodeposition, in contrast to evaporation, is extendible to high-tin content lead-free alloys and large 300 mm wafers.

A generic C4 structure consists of all of the elements beginning with the ball-limiting metallurgy (hereinafter the "BLM"). The multi-layer BLM structure generally consists of an adhesion layer, a reaction barrier layer, and a wettable layer to facilitate solder bump joining between the device and the interconnection structure, the chip carriers. The different metal layers in the BLM structure are chosen to be compatible with the solder alloys and with each other, to meet not only stringent electrical, mechanical and reliability requirements in the C4 joint, but also to allow easy fabrication.

A detailed description of the elements comprising the multilayer BLM structure and C4 bumps are summarized as follows.

1) The first layer to be deposited on the top surface of wafer is the adhesion layer of the BLM which provides adhesion to the underlying substrate. This layer can also serve as a diffusion/reaction barrier layer to prevent any interaction of the silicon wafer and its back-end-of-line (BEOL) wiring layers with the overlying interconnection structure. This is a thin layer typically deposited by sputtering or evaporation on the surface of the wafer passivation layer, which is commonly made of polymer, oxide or nitride materials. Candidates for adhesion layer are Cr, TiW, Ta, W, Ti, TiN, TaN, Zr etc. to just name a few, on the order of hundreds to thousands angstroms in thickness.

2) The next layer of the BLM is a reaction barrier layer which is solderable by the molten solder but reacts slowly (limited reaction) to allow for multiple reflow cycles (or rework cycles) without being totally consumed. This layer is typically on the order of thousands of angstroms to microns in thickness.

3) The final layer of the BLM is the wettable layer, allowing easy solder wettability and fast reaction with solder. A typical example is copper, typically in the range of a few hundreds to thousands of angstroms in thickness, deposited by sputtering, electroless- or electrolytic plating. In some special chip joining applications, Cu thickness can be in the range of microns in thickness.

4) For the C4 bumps formed on top of the BLM structure, a number of manufacturing processes have been developed that include evaporation, plating, stencil printing, paste screening and solder jetting, and molten solder injection, to name a few.

5) After formation of the bumps, solder bumps are reflowed. Reflow is done typically in an inert or reducing atmosphere ($H_2/N_2$) in a belt furnace or in a vacuum furnace or in an oven. During reflow, intermetallic compounds form between solder and the reaction barrier layer. These compounds serve to provide good mechanical integrity for a reliable solder joint.

6) The wafer is diced into chips, through a dice, sort and pick operation. Good chips (those meeting specifications) are picked and are aligned and flip joined to a chip carrier through the use of a suitable flux or fluxless joining.

SUMMARY OF THE INVENTION

It is therefore an aspect of the present invention to provide a BLM structure for flip chip attachment that is suitable for use with and uses a lead free solder.

It is another object of the invention to provide flip chip electrical connections that reduce the occurrence of soft errors in computer chips.

The present invention focuses on cost-effective, environmentally sound, reliable BLM for lead-free solders in C4 joints. The present invention also provides the enabling processes for fabrication of an integrated C4 structure, i.e., the selection of the BLM and the deposition and etching processes used to produce the final BLM structure.

A lead-free C4 typically has Sn as the predominate component, typically greater than 90 wt. %, and one or more alloying elements. Because of the nature of Sn, which is highly reactive, lead-free solders require a more robust reaction barrier layer to protect the terminal metal in the ball-limiting metallurgy and the underlying wiring layers from attack by the Sn-rich solder. The most likely candidates for lead-free solders are tin alloys with a few weight percent of silver, copper, zinc, bismuth, or antimony.

The elimination of lead from electronic solders is desirable because of the toxicity of lead. The use of lead-free solders also provides a means of limiting the soft errors in circuitry that are caused by alpha particle emission from the solder.

The solders may be produced by electroplating, evaporation, paste screening or an injection molded solder process which was disclosed in U.S. Pat. Nos. 5,244,143; 5,775,569; 6,003,757; and 6,056,191.

Thus the invention is directed to an interconnection structure suitable for flip-chip attachment of microelectronic device chips to chip carriers, a three-layer ball limiting metallurgy comprising an adhesion layer for deposition on a wafer or substrate; a solder reaction barrier layer of a material selected from the group consisting of Ti, TiN, Ta, TaN, Zr, ZrN, V and Ni; and a solder wettable layer. The adhesion layer may be formed of a material selected from the group consisting of Cr, TiW, TiN, TaN, Ti, Ta, Zr, and ZrN. The solder wettable layer may be formed of a material selected from the group consisting of Cu, Pd, Co, Ni, Au, Pt, and Sn. The interconnection structure may further comprise an optional fourth layer formed of a material selected from the group consisting of Au and Sn, if Au or Sn is not used in the third layer. In one embodiment, the adhesion layer is comprised of one of Cr and TiW, the reaction barrier is comprised of Ti, and the solder wettable layer is comprised of one of Cu, Co, Ni, Pd and Pt.

The invention is also directed to an interconnection structure suitable for flip-chip attachment of microelectronic device chips to packages, comprising a two-layer ball-limiting composition comprising an adhesion/reaction barrier layer, wherein the adhesion/reaction barrier layer serves both as an adhesion and reaction barrier layer, and a solder wettable layer, the adhesion/barrier layer being for placement between a microelectronic device and the solder wettable layer, and wherein the solder wettable layer is of a metal reactive with components of a tin-containing lead-free solder, so that the solder wettable layer is consumed during soldering, wherein the adhesion/reaction barrier layer remains after being placed in contact with the lead free solder during soldering; and one or more lead-free solder balls are selectively situated on the solder wettable layer, the lead-free solder balls comprising tin as a predominant component and one or more alloying components. The adhesion/reaction barrier layer may be comprised of a material selected from the group consisting of Ti, TiN, TiW, Ta, TaN, Zr, ZrN and V. The solder wettable layer may be comprised of a material selected from the group consisting of Cu, Ni, Co, Pd, Pt, Au and Sn. The interconnection structure may further comprise an optional third layer comprised of Au or Sn, if the second layer is not formed of Au or Sn. Preferably, the lead-free solder ball is comprised of a material that substantially avoids alpha particle emission. The alloying components are selected from the group consisting of Sn, Bi, Cu, Ag, Zn and Sb. The adhesion/reaction barrier layer may comprise Ti and the solderable layer may comprise one of Cu, Co, Ni, Pd and Pt.

The invention is also directed to an interconnection structure suitable for flip-chip attachment of microelectronic device chips to packages, comprising a three-layer ball-limiting composition comprising an adhesion layer, a reaction barrier layer on top of the adhesion layer and a solder wettable layer, wherein the adhesion/barrier layer is between a microelectronic device and the solder wettable layer and wherein the solder wettable layer is of a composition sufficiently reactive with components of a tin-containing lead free solder, and the reaction barrier layer is substantially less-reactive with solder after being placed in contact therewith in a solder joining process; and one or more lead-free solder balls selectively situated on the solder wettable layer, the lead-free solder balls having tin as a predominant component and one or more alloying components selected from the group consisting of Cu, Zn, Ag, Bi and Sb, whereby the lead-free solder ball substantially avoids alpha particle emission and induced soft logic errors which result therefrom. The solderable layer is formed of a material selected from the group consisting of Cu, Ni, Co, Pd, PdNi, PdCo, NiCo, Au, Pt and Sn.

The invention is further directed to a method for forming an interconnection structure suitable for flip-chip attachment of microelectronic device chips to packages, comprising forming a ball limiting composition on a substrate; forming a resist pattern on the ball limiting composition; etching the ball limiting composition by using the resist as an etch mask; removing the resist from remaining ball limiting composition; and depositing solder on the ball limiting composition. The solder may be substantially lead free. The ball limiting composition may be formed by depositing an adhesion layer on the substrate; depositing a reaction barrier layer on the adhesion layer; and depositing a solder wettable layer on the barrier layer. The reaction barrier layer may be comprised of a material selected from the group consisting of Ti, TiN, Ta, TaN, Zr, ZnN, V and Ni. The adhesion layer may be deposited by sputtering, plating or evaporating, and may have a thickness of about 100 to about 4000 Angstroms. The reaction barrier layer may also be deposited by sputtering, plating or evaporation, and may have a thickness of about 100 to about 20,000 angstroms. The solder wettable layer also may be deposited by sputtering, plating or evaporation, and have a thickness of about 100 to about 20,000 angstroms.

The method may further comprise depositing a layer comprising Au or Sn on the solder wettable layer. The layer deposited on the solder wettable layer may have a thickness of between substantially 100 to substantially 20,000 angstroms, and may be deposited by one of sputtering, electro- or electroless plating or evaporation. The ball limiting composition may be formed by depositing an adhesion/reaction barrier layer on the substrate; and depositing a solder wettable layer on the barrier layer. The method preferably further comprises annealing the ball limiting composition at 150-250 degrees C. for 30 to 60 minutes.

The invention is also directed to a method for forming an interconnection structure suitable for flip-chip attachment of microelectronic device chips to chip carriers, comprising depositing an adhesion layer on a wafer or substrate serving as the chip carrier; depositing a solder reaction barrier layer on the adhesion layer; depositing a solder wettable layer on the reaction barrier layer; depositing a lead free solder on the solder wettable layer; and reflowing the solder so that the solder wettable layer diffuses into the lead free solder. The solder wettable layer may contain Cu, and the Cu may diffuse into the solder. The lead free solder may be substantially pure Sn, and a binary Sn—Cu lead-free solder is thus formed during reflowing. The lead free solder may substantially binary Sn—Ag, and a ternary Sn—Ag—Cu lead-free solder is thus formed during reflowing. The number of elements in the solder is increased by at least one element, by the diffusion. A eutectic solder may be formed. Preferably, the method further comprises annealing at 150-250 degrees C. for 30 to 60 minutes.

The invention also is directed to a method for forming an interconnection structure suitable for flip-chip attachment of microelectronic device chips to chip carriers, comprising depositing an adhesion layer on a wafer or substrate serving as the chip carrier; depositing a solder reaction barrier layer which is solder wettable on the adhesion layer; depositing a lead free solder on the solder wettable layer; and reflowing the solder so that the solder wettable layer diffuses into the lead free solder. The solder wettable layer may contains Cu, and the Cu will thus dissolve into the solder. The lead free solder may be substantially pure Sn, and a binary Sn—Cu lead-free solder is thus formed during reflowing. The lead free solder may be substantially pure Sn—Ag, and a ternary Sn—Ag—Cu lead-free solder thus is formed during reflowing. The number of elements in the solder is increased by at least one element, by the dissolution of the Cu. A eutectic solder may be formed. The method may further comprising annealing at 150-250 degrees C. for 30 to 60 minutes.

A preferred embodiment of the invention is a three layer BLM structure comprising a Cr adhesion layer on a substrate, a Cu seed layer for plating, and a Ni reaction barrier layer on the Cu layer. It can be a four layer structure when a Cu layer is formed on top of the Ni layer. The top Cu layer may be dissolved into a lead free solder to form a binary Sn—Cu alloy or a ternary Sn—Ag—Cu alloy wherein the solder materials were originally plated as pure Sn and Sn—Ag, respectively, before the incorporation of Cu as an additional element.

BRIEF DESCRIPTION OF THE DRAWINGS

These and other aspects, features, and advantages of the present invention will become apparent upon further consideration of the following detailed description of the invention when read in conjunction with the drawing figures, in which.

DESCRIPTION OF THE INVENTION

Variations described for the present invention can be realized in any combination desirable for each particular application. Thus particular limitations, and/or embodiment enhancements described herein, which may have particular advantages to the particular application need not be used for all applications. Also, it should be realized that not all limitations need be implemented in methods, systems and/or apparatus including one or more concepts of the present invention.

Figure 1:
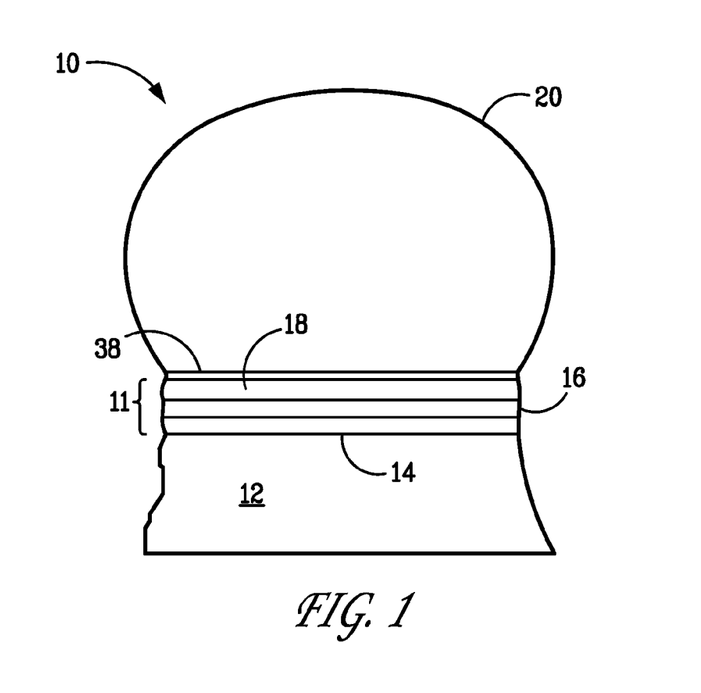
FIG. 1 is a cross-sectional view of a first embodiment of C4 structure in accordance with the invention.

Referring to FIG. 1, an interconnection structure 10 suitable for the connection of microelectronic integrated circuit (IC) chips to packages is provided by this invention. In particular, the invention pertains to the area-array or flip-chip technology often called C4 (controlled collapse chip connection). The BLM (also named an under bump metallurgy (UBM)) 11 is deposited on passivated integrated circuit (IC) device 12 (e.g., a silicon wafer). A first layer of the BLM 11 is an adhesion/diffusion barrier layer 14 which may be a metal or compound selected from the group consisting of Cr, W, Ti, Ta, Ta, Ti, V, Zr and their alloys (or compounds), and may have a thickness of about 100 to 4,000 Angstroms, and may be deposited by evaporation, sputtering, electroplating or other known techniques. A solder reaction barrier layer 16 of a metal or compound selected from the group consisting of Ti, Ta, Zr, W, V, Ni and their alloys (or compounds) may be subsequently deposited on the adhesion layer, by for example, sputtering, plating, or evaporation to a thickness of about 500 to 25,000 Angstroms. Top layer 18 is a solderable layer consisting of a metal selected from the group of Cu, Pd, Pt, Ni, Co, Au, Sn and their alloys, by for example, sputtering, plating, or evaporation to a thickness of about 500 to 10,000 Angstroms. In some special applications, when Cu is used as the wettable layer, a thick Cu layer, in the range of 1-6 microns can be used to form the alloying element with Pb-free solders. An optional fourth layer 38, such a thin layer of gold or Sn, may be deposited on layer 18 to act as a protection layer against oxidation or corrosion, under certain conditions if Au and Sn are not already used in the third layer. With the described layered structure if the selected element is already used in the prior layer it will not be used for the subsequent layer to avoid duplication. Solder 40 is then applied, as shown in FIG. 1.

The C4 structure 10 may be completed with a lead-free solder ball 20 comprising tin as the predominate component and one or more alloying elements selected from Bi, Ag, Cu, Zn, Ni, Au, In and Sb.

Example 1

A Three Layer UBM

In accordance with the present invention, a preferred adhesion layer 14 is Cr, TiW or Ti, which is preferably either sputtered or evaporated, at a preferred thickness of about 100 to 3000 angstroms. The thickness of the adhesion layer 12 can vary widely as long as both good adhesion and good barrier properties are maintained. If blanket TiW is deposited and subsequently etched as the final step in forming the patterned BLM structure 11, the film thickness should be minimized consistent with adequate performance. An alternative adhesion layer is Cr or Ti at a thickness of about 100 to 3000 angstroms.

The second layer 16 is a solder reaction barrier layer, typically a few thousand angstroms to 2 microns in thickness, deposited by sputtering, evaporation or plating. Since the high tin content Pb-free solders are much more reactive than the Pb-rich PbSn solder alloys, Cu, widely used in the high Pb solder, is shown to form thick tin-copper intermetallics at the interface between copper and a high-tin solder and be totally consumed in just few reflow cycles in the thin-film C4 structures, leading to a failure in the integrity of the structure. Thus, a metal other than copper must be used as a solder reaction barrier layer of the BLM in a lead-free C4.

In accordance with the invention, it has been found that suitable solder reaction barrier layers may be formed of titanium, titanium nitride, tantalum, tantalum nitride, zirconium, zirconium nitride, vanadium or Ni, with Ti being the preferred material. If Ti also adheres well to the device passivation layer then the adhesion and reaction barrier layers can be merged into one layer by the use of Ti.

The third layer 18 is a solder wettable layer. Layer 18 is easily wet by, and potentially totally dissolved into, the molten solder during reflow joining, thus allowing for the formation of a reliable metallurgical joint to the BLM pad through the formation of intermetallics with the reaction barrier layer. The wettable layer is a metal selected from the group consisting of Cu, Pd, Pt, CO, Ni, Sn, Au and their alloys. Both copper and palladium react very rapidly with high-tin alloys and do not provide a suitable reaction barrier layer. However, these metals all react and wet well with solder and therefore serve as the top layer for wetting and joining the C4 solder.

In an added benefit, Cu dissolving into solder can be used as an alloying element for the solder. For example, when Cu is dissolved into pure Sn solder, it forms the binary Sn—Cu eutectic alloy. When dissolved into binary SnAg alloy, it forms the ternary eutectic Sn—Ag—Cu solder. Both Sn—Cu and Sn—Ag—Cu are the leading Pb-free solder candidates for microelectronic assembly. The dissolution and incorporation of Cu as an added alloying element in solder is shown to particularly simplify the plating processes. Instead of plating a ternary alloy of Sn—Ag—Cu, which is very complicated, a simpler plating of binary SnAg alloy can be performed, with the third element of Cu coming from the BLM pad. The same approach is applied to the plating of pure Sn which is very simple, and the subsequent reaction of pure Sn with Cu, which is from the BLM pad, to form a simple binary alloy. This is much simpler than the plating of a binary Sn—Cu alloy. Maintaining the bath chemistry and precise control of solder composition during the plating of multicomponent solder alloys is very complicated, and this complexity can be avoided using this approach. It is noted that the Cu rapidly diffuses into the essentially liquid solder during the reflow portion of the process, thus assuring that the composition of the solder ball is relatively uniform.

Figure 1A:
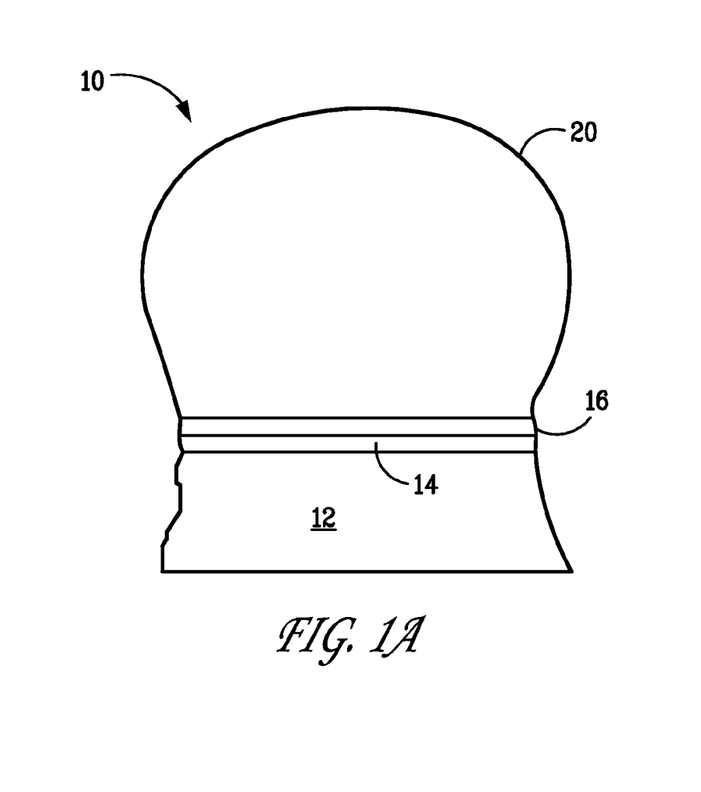
FIG. 1A is a cross-sectional view of the embodiment of FIG. 1 after solder reflow.
Figure 4:
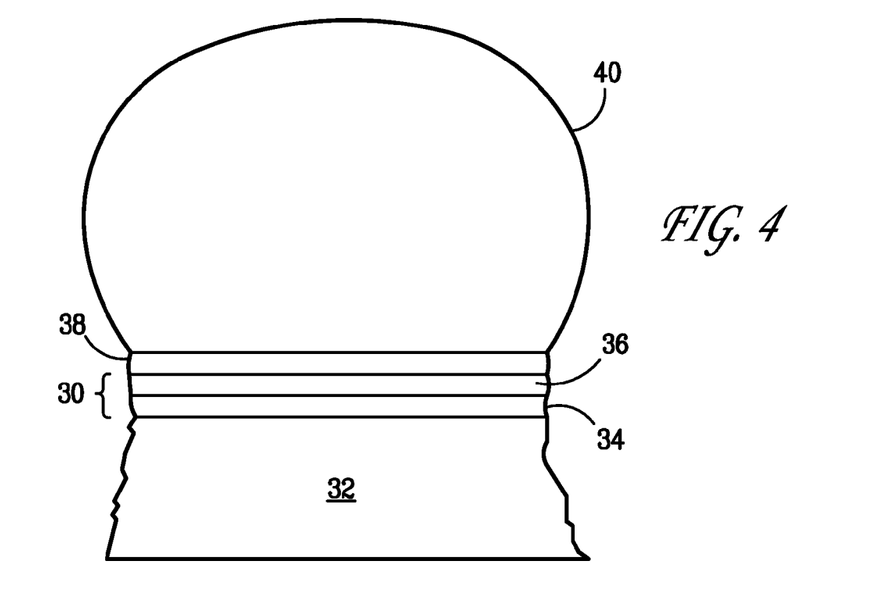
FIG. 4 is a cross-sectional view of a second embodiment of C4 structure in accordance with the invention.
Figure 4A:
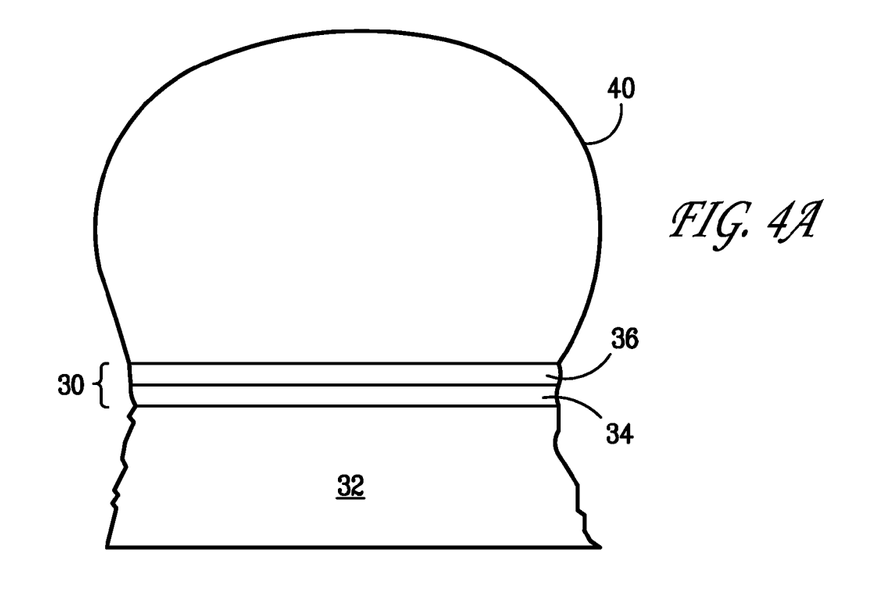
FIG. 4A is a cross-sectional view of the embodiment of FIG. 4 after solder reflow.

The manner in which the solder wettable layer is diffused into the solder ball is shown in FIG. 1A for the first embodiment of the invention, and in FIG. 4A for a second embodiment of the invention.

The solderable layer may be sputtered, evaporated or plated using the same procedure as that used for the deposition of the other BLM layers. Subsequently, the blanket films must be patterned to form the BLM 11 in the finished structure depicted in FIG. 1.

Example 2

A Four Layer UBM

In this example, the first layer is preferably Cr or TiW. The second layer is preferably Ti, Zr, V, or their alloys (or compounds). The third layer is preferably Cu, CO, Ni, Pd, Pt or their alloys. A fourth layer may be Au or Sn.

Example 3

A Simple Two Layer UBM

In this example, the first layer is preferably Ti which serves both as an adhesion layer and a reaction barrier layer. The second layer is selected from the group consisting of Cu, CO, Ni, Pd, Pt, Sn or their alloys.

In all three structures Cu is the preferred layer for the reaction, dissolution and incorporation into the solder alloy during reflow joining to form the Sn—Cu or Sn—Ag—Cu solder alloys by simply requiring the plating of the pure Sn or Sn—Ag, respectively, as the bump material.

The melting properties of the solder alloy that is used over the UBM must be consistent with the requirements of the C4 application. This constraint limits the preferred alloys to those with compositions near the tin-silver eutectic (which contains 2.0-3.8% silver by weight), tin-copper, tin-bismuth, tin-silver-copper ternary eutectic and tin-antimony alloys. The tin-silver eutectic has a melting point of 221 degrees C. and is suitable for this application. High-tin tin-copper alloys melt at 227 degrees and tin-bismuth alloys also melt in a suitable range. However, the Sn—Bi phase diagram suggests that alloys with bismuth concentrations approximately 20% by weight will, upon reflow, separate into a tin-rich phase and the tin-bismuth eutectic. For this reason, the preferred embodiment employs tin-bismuth solders with bismuth contents below about 10% by weight. Tin-antimony alloys with antimony contents of less than about 5% by weight also have suitable melting ranges for C4 applications.

The preferred deposition method for the solder is electrodeposition (either direct electrodeposition of the alloy or sequential deposition of the alloy components), stencil printing or by injection molded solder process or by paste screening.

Figure 2A:
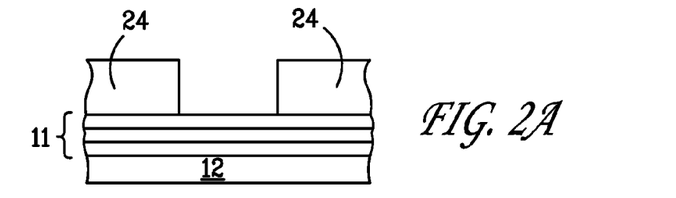
FIGS. 2A to 2D show steps in accordance with a first method for forming the C4 structures in accordance with the invention.

FIG. 2A to FIG. 2D illustrate steps in producing the structure of FIG. 1. In FIG. 2A the BLM 11 of FIG. 1, including layers 14, 16 and 18 is produced on a wafer or substrate 12, as explained above. The C4 pattern is defined on the wafer with an appropriate photoresist pattern 24, of thickness at least as great as the thickness of the solder which is to be deposited.

Figure 2B:
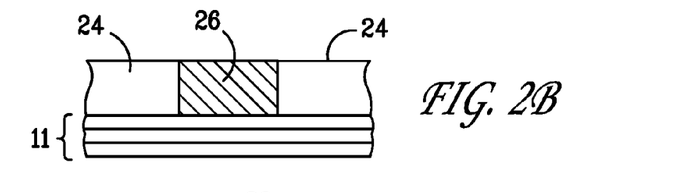

Referring to FIG. 2B, the lead-free solder 26 is deposited into the resist openings by means of plating, paste screening, stencil printing or molten solder injection, to name a few. Sequential electroplating of the solder components, followed by mixing upon reflow, is an alternative to direct plating of the alloy.

Figure 2C:
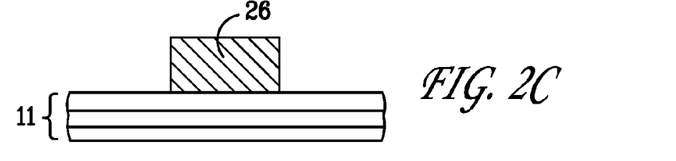
Figure 2D:
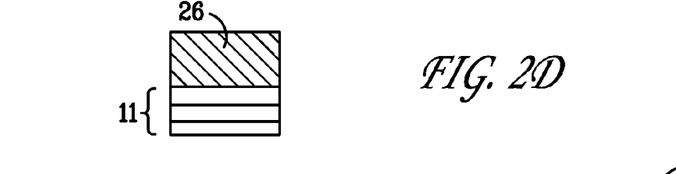

Referring to FIG. 2C, the resist 24 is removed, by a conventional resist-stripping process. Referring to FIG. 2D the layers 14, 16 and 18 of the BLM 11 are removed, except for regions under the solder 26, by selective electroetching or wet chemical etching, dry etching or a combination of the techniques. The TiW or Cr layer 14 may also be removed by reactive ion etching (RIE) or ion-milling.

The solder is then reflowed in an appropriate atmosphere to form a solder ball, as illustrated in FIG. 1.

The wafer 12 may then be diced, sorted, picked and good chips are joined to a ceramic or organic chip carrier employing a suitable flux or by fluxless joining.

Figure 3A:
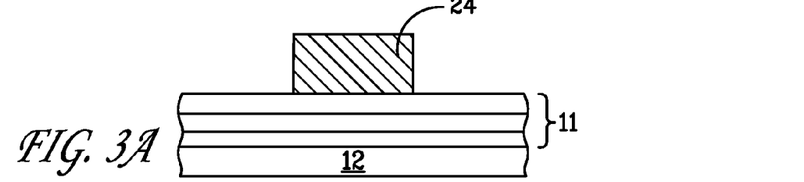
FIGS. 3A to 3D show steps in accordance with a second method for forming the C4 structures in accordance with the invention.
Figure 3B:
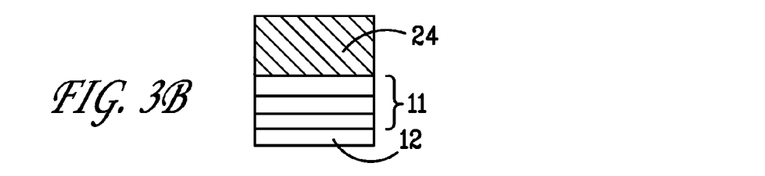
Figure 3C:
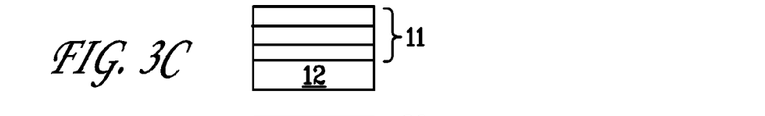
Figure 3D:
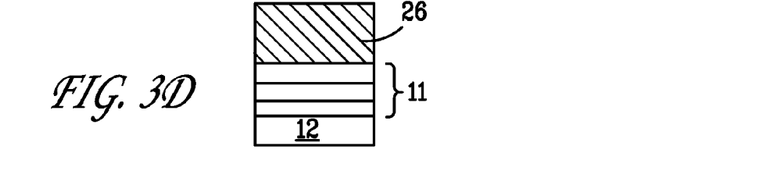

FIG. 3A to FIG. 3D illustrate an alternative process to form the structure of FIG. 1. In FIG. 3A, a photoresist pattern 24, is deposited over the blanket BLM 11. FIG. 3B illustrates the etching of the layers of the BLM 11 which is not covered under the photoresist 24. The photoresist pattern 24 being used as an etch mask to pattern the BLM. In FIG. 3C, the photoresist pattern 24 is stripped off the patterned BLM layers. In FIG. 3D, the solder bumps are selectively deposited on the BLM 11 by means of paste screening, molten solder injection, stencil printing, electroless and electrolytic plating, etc.

The solder bump 26 is then reflowed in an appropriate atmosphere.

The wafer is then diced, sorted and picked. Good chips are selected and joined to a chip carrier either with a suitable flux or fluxlessly joined.

FIG. 4 is a cross-sectional view of a second embodiment of C4 structure in accordance with the invention. The BLM 30 is a two layer structure suitable for deposition on a substrate or wafer with oxide, nitride or polyimide passivation 32. The first layer 34, which is deposited on the surface of the passivated wafer or substrate may be Cr, Ti, Ta, Zr, V or their alloys. The next layer 36 serves as a solderable layer, is deposited on the layer 34, and may be selected from the group of Cu, Pd, Pt, Co, Ni, Sn. Layer 36 should be a material other than that already selected for the first layer. An optional third layer 38, such as a thin layer of gold or Sn, may be deposited on layer 36 to act as an oxidation protection layer. Solder 40 is then applied, as in FIG. 1.

As noted above, when the optional layer 38 is not applied and the top layer of FIG. 4 is, for example Cu, the manner in which the solder wettable layer is dissolved into the solder ball 40 is shown FIG. 4A.

The embodiment illustrated in FIG. 4 may be formed using either one of the methods illustrated in FIG. 2A to FIG. 2D or in FIG. 3A to FIG. 3D.

Example 4

A Two Layer UBM

The first layer is preferably Ti or its alloys, with Ti serving both as an adhesion and reaction barrier metal. The second layer above this layer is selected from the group consisting of Cu, CO, Ni, Pd, Sn and Pt.

Example 5

A Three Layer BML Structure

A three layer BLM structure comprising a Cr adhesion layer deposited on a substrate, a Ni reaction barrier layer on the Cr layer, and a Cu seed layer for plating deposited on the Cr layer. A lead free solder of Sn, or an SnAg alloy is deposited on the Cu layer. When reflowed, as described above, the Cu layer is dissolved into the resulting solder ball to alloy with the solder. The solder is preferably lead-free, and a binary Sn—Cu alloy or a ternary Sn—Ag—Cu alloy is formed when the Cu is dissolved into the solder wherein the original solders were pure Sn and binary Sn—Ag, respectively.

Example 6

A four layer structure comprising a Cr adhesion layer for deposit on a substrate, a Cu layer on the Cr layer, a Ni reaction barrier layer on the Cu layer, a layer of Cu on top of the Ni layer. Upon reflow of a plated pure Sn or binary Sn—Ag solder, the top layer of Cu dissolves into the lead-free solder to form a binary Sn—Cu alloy or a ternary Sn—Ag—Cu alloy, respectively. The BLM metallurgy of the present invention may be further improved in robustness by annealing at 150-250 degrees C. for 30 to 60 minutes after BLM patterning.

Thus, while there have been shown and described and pointed out fundamental novel features of the invention as applied to currently preferred embodiments thereof, it will be understood that various omissions, substitutions and changes in the form and details of the method and product illustrated, and in their operation, may be made by those skilled in the art without departing from the spirit of the invention. In addition it is to be understood that the drawings are not necessarily drawn to scale. It is the intention, therefore, to be limited only as indicated by the scope of the claims appended herewith and equivalents thereof.

It is noted that the foregoing has outlined some of the more pertinent objects and embodiments of the present invention. The concepts of this invention may be used for many applications. Thus, although the description is made for particular arrangements and methods, the intent and concept of the invention is suitable and applicable to other arrangements and applications. It will be clear to those skilled in the art that other modifications to the disclosed embodiments can be effected without departing from the spirit and scope of the invention. The described embodiments ought to be construed to be merely illustrative of some of the more prominent features and applications of the invention. Other beneficial results can be realized by applying the disclosed invention in a different manner or modifying the invention in ways known to those familiar with the art. Thus, it should be understood that the embodiments has been provided as an example and not as a limitation. The scope of the invention is defined by the appended claims.

Having thus described our invention, what we claim as new and desire to secure by Letters Patent is as follows:

1. An interconnection structure suitable for flip-chip attachment of microelectronic device chips to packages, comprising:
  a two-layer ball-limiting composition comprising an adhesion/reaction barrier layer, wherein the adhesion/reaction barrier layer serves both as an adhesion and reaction barrier layer, and a solder wettable layer, said adhesion/barrier layer being for placement between a microelectronic device and said solder wettable layer, and wherein said solder wettable layer is of a metal reactive with components of a tin-containing lead-free solder, so that said solder wettable layer is consumed during soldering, wherein the adhesion/reaction barrier layer remains after being placed in contact with said lead free solder during soldering; and
  one or more lead-free solder balls selectively situated on said solder wettable layer, said lead-free solder balls comprising tin as a predominant component and one or more alloying components;
  wherein said adhesion/reaction barrier layer is comprised of a material selected from the group consisting of Zr, and ZrN.

2. The interconnection structure defined in claim 1, wherein said solder wetting layer is comprised of a material selected from the group consisting of Cu, Ni, Co, Pd, Pt, Au and Sn.

3. The interconnection structure defined in claim 1, further comprising an optional third layer comprised of Au or Sn, if the second layer is not formed of Au or Sn.

4. The interconnection structure defined in claim 1, wherein said lead-free solder ball is comprised of a material that substantially avoids alpha particle emission.

5. The interconnection structure defined in claim 1, wherein said alloying components are selected from the group consisting of Sn, Bi, Cu, Ag, Zn and Sb.

6. The interconnection structure defined in claim 1, wherein said adhesion/reaction barrier layer comprises Ti and said solder wettable layer comprises one of Cu, Co, Ni, Pd and Pt.

* * * * *